(12) United States Patent
Loopstra

(10) Patent No.: US 6,710,353 B1
(45) Date of Patent: Mar. 23, 2004

(54) ACTUATOR AND TRANSDUCER

(75) Inventor: Erik R. Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/435,638

(22) Filed: Nov. 8, 1999

(30) Foreign Application Priority Data

Nov. 10, 1998 (EP) .............................................. 98203780

(51) Int. Cl.$^7$ ......................... H02K 41/00; G03B 27/42
(52) U.S. Cl. ............................ 250/441.11; 250/442.11; 250/491.1; 250/492.1; 250/492.2; 250/526; 250/400; 250/453.11; 318/38; 318/640; 318/653
(58) Field of Search ....................... 250/442.11, 453.11, 250/491.1, 492, 526, 400, 441.11, 492.1; 318/640, 653, 38

(56) References Cited

U.S. PATENT DOCUMENTS

| | | | | |
|---|---|---|---|---|
| 3,599,020 A | * | 8/1971 | Harris et al. ................... 310/13 |
| 4,084,095 A | * | 4/1978 | Wolfe ....................... 250/492.2 |
| 4,644,203 A | * | 2/1987 | Thomas et al. ................ 310/67 |
| 4,952,858 A | | 8/1990 | Galburt |
| 5,120,034 A | * | 6/1992 | Van Engelen et al. ......... 269/73 |
| 5,477,304 A | * | 12/1995 | Nishi ........................... 355/53 |
| 5,914,830 A | * | 6/1999 | Kaldec et al. ............ 360/78.14 |

FOREIGN PATENT DOCUMENTS

| | | |
|---|---|---|
| JP | 9-56135 | 2/1997 |
| WO | WO 97/33204 | 9/1997 |

OTHER PUBLICATIONS

Patent Abstracts of Japan vol. 1997, No. 06, Jun. 30 1997 re: JP 09 056135A—Abstract; figures.

* cited by examiner

Primary Examiner—John R. Lee
Assistant Examiner—David A. Vanore
(74) Attorney, Agent, or Firm—Pillsbury Winthrop LLP

(57) ABSTRACT

An actuator comprises a magnet yoke (10*a*, 10*b*) and a carrier member (2) movable relative to the magnet yoke. The magnet yoke (10*a*, 10*b*) has at least one permanent magnet (14) and the carrier member (20) is positioned in the magnetic field produced by this magnet. The carrier member (20) has an auxiliary magnetic member (28) that produces a relative bias force between the carrier member (20) and the magnet yoke (10*a*, 10*b*). The bias force will be used to compensate for a weight applied to the device and acts as a bearing with a very large compliance. The carrier member (2) also comprises a coil (26). Passing current through the coil (26) produces a Lorentz force for further control of the actuator; alternatively, the device provides a velocity transducer by sensing the EMF generated in the coil by relative motion of the carrier member (20) and magnet yoke (10*a*, 10*b*).

20 Claims, 13 Drawing Sheets

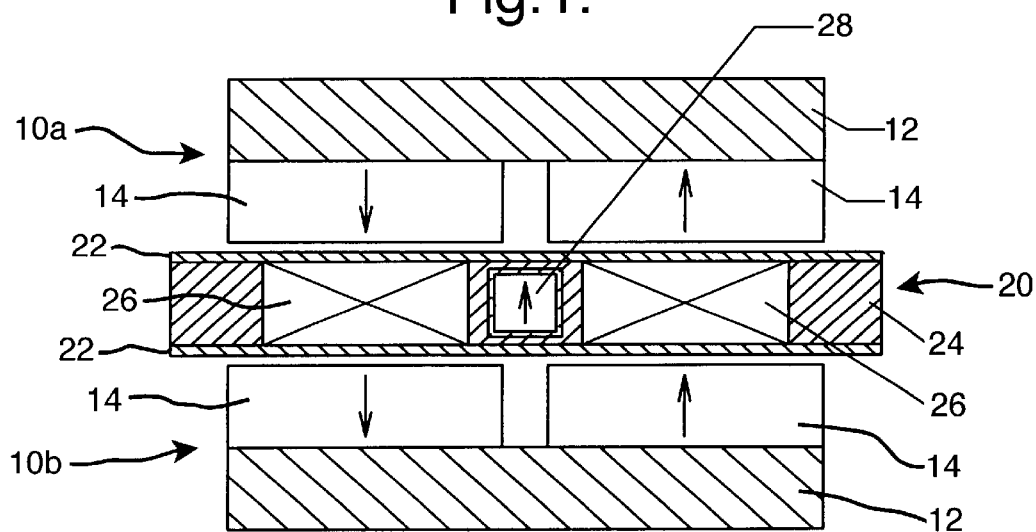
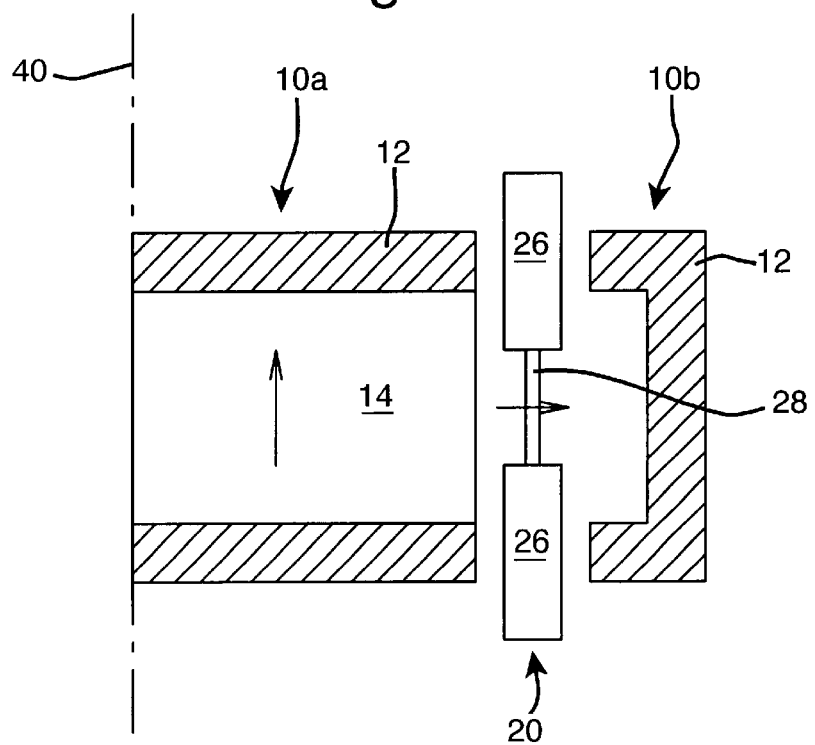

Fig.5(e).
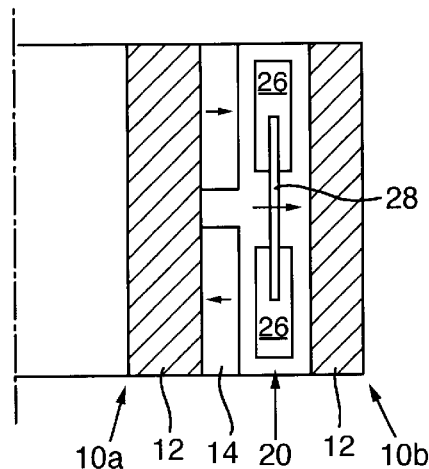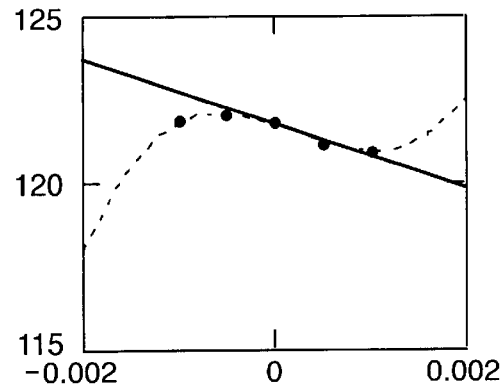
Fig.5(f).
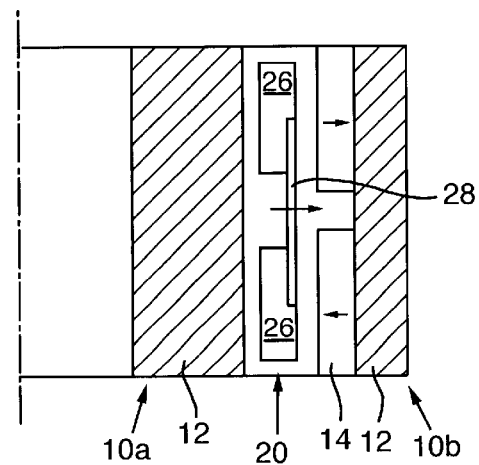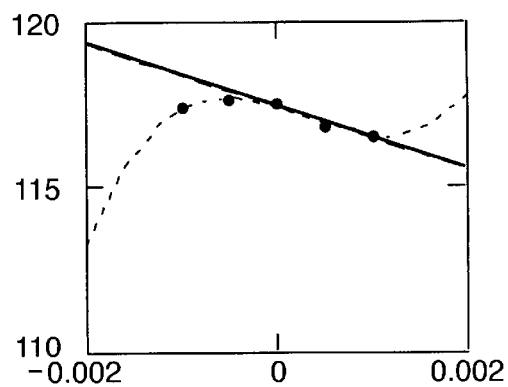

Fig.6(a).
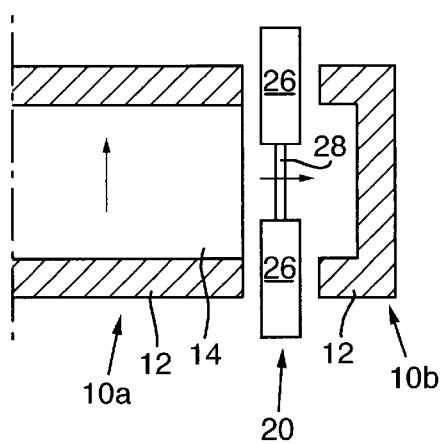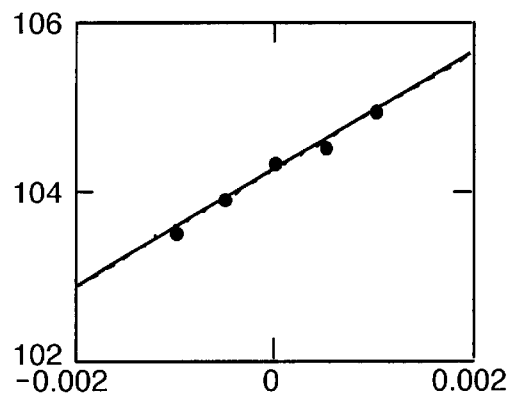
Fig.6(b).
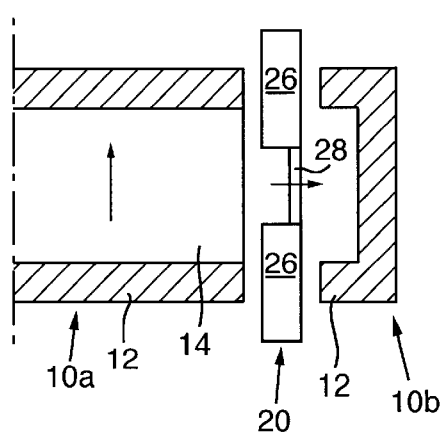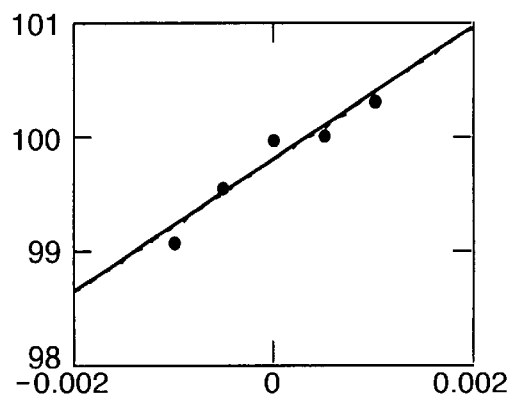

Fig.7.

| | fx | fy | tz |
|---|---|---|---|
| 1 | 5.66 | 0.00 | 0.02 |
| 2 | 7.22 | 0.00 | 0.01 |
| 3 | 3.31 | 0.01 | 0.01 |
| 4 | 1.55 | 0.00 | 0.00 |

Fig.14.

| Fig. | T | $F_T$ | $F_L$ | $F_A$ | S |
|---|---|---|---|---|---|
| 5(a) | I | 182 | 79 | 103 | 0.25 |
| 5(b) | I | 102 | 46 | 56 | 0.14 |
| 5(c) | I | 121 | 53 | 68 | 0.37 |
| 5(d) | I | 144 | 47 | 97 | 0.12 |
| 5(e) | I | 122 | 40 | 82 | 1.00 |
| 5(f) | I | 118 | 41 | 77 | 1.00 |
| 5(g) | I | 112 | 35 | 77 | 0.98 |
| 6(a) | II | 104 | 56 | 48 | -0.58 |
| 6(b) | II | 100 | 57 | 43 | -0.69 |

Fig.8.

| Δx | Δy | fx | fy | tz |
|---|---|---|---|---|
| 0.00 | 0.0 | 5.53 | 0.0 | 0.0 |
| 0.50 | 0.0 | 5.52 | 0.0 | 0.0 |
| 0.95 | 0.0 | 5.46 | 0.0 | 0.0 |
| -0.95 | 0.0 | 5.46 | 0.0 | 0.0 |
| -0.50 | 0.0 | 5.50 | 0.0 | 0.0 |
| 0.00 | 0.5 | 5.58 | -0.01 | -4.53 |
| 0.00 | 0.7 | 5.65 | -0.05 | -6.07 |
| 0.00 | -0.7 | 5.70 | 0.11 | 7.00 |
| 0.00 | -0.5 | 5.66 | 0.07 | 4.99 |

Fig.9.

|  | Δx | Δy |
|---|---|---|
| Δfx | -74 | 243 |
| Δfy | 0 | 157 |
| tz | 0 | 10 |

Fig.10.

| Δx | Δy | fx | fy | tz |
|---|---|---|---|---|
| 0.00 | 0.0 | 1.20 | 0.0 | 0.0 |
| 0.50 | 0.0 | 1.20 | 0.0 | 0.0 |
| 0.95 | 0.0 | 1.17 | 0.0 | 0.0 |
| -0.95 | 0.0 | 1.21 | 0.0 | 0.0 |
| -0.50 | 0.0 | 1.20 | 0.0 | 0.0 |
| 0.00 | 0.5 | 1.22 | -0.10 | -1.03 |
| 0.00 | 0.7 | 1.24 | -0.18 | -1.38 |
| 0.00 | -0.7 | 1.22 | 0.12 | 1.53 |
| 0.00 | -0.5 | 1.21 | 0.08 | 1.08 |

Fig.11.

|  | Δx | Δy |
|---|---|---|
| Δfx | -30 | 57 |
| Δfy | 0 | 257 |
| tz | 0 | 2.2 |

Fig.12.

| Δx | Δy | fx | fy | tz |
|---|---|---|---|---|
| 0.00 | 0.0 | 1.29 | 0.0 | 0.0 |
| 0.50 | 0.0 | 1.26 | 0.0 | 0.0 |
| 0.95 | 0.0 | 1.11 | 0.0 | 0.0 |
| -0.95 | 0.0 | 1.37 | 0.0 | 0.0 |
| -0.50 | 0.0 | 1.31 | 0.0 | 0.0 |
| 0.00 | 0.5 | 1.29 | -0.10 | -1.33 |
| 0.00 | 0.7 | 1.30 | -0.18 | -1.75 |
| 0.00 | -0.7 | 1.31 | 0.25 | 2.14 |
| 0.00 | -0.5 | 1.31 | 0.16 | 1.52 |

Fig.13.

|  | Δx | Δy |
|---|---|---|
| Δfx | -180 | 14 |
| Δfy | 0 | 357 |
| tz | 0 | 3.1 |

ACTUATOR AND TRANSDUCER

BACKGROUND OF THE INVENTION

1. Field of the Invention

The invention also relates to a lithographic projection apparatus, and more particularly to a lithographic projection apparatus that has a Lorentz actuator connected to a mask table or a substrate table of the lithographic projection apparatus.

The invention relates to actuators, such as Lorentz actuators, and also to velocity transducers.

2. Discussion of Related Art

Lorentz actuators comprise a permanent magnet, which produces a magnetic field, and a current element positioned in the magnetic field. They work on the same principle as an electric motor, namely that charge carriers moving through a magnetic field experience a force mutually perpendicular to their velocity and the magnetic field, known as the Lorentz force. The force is given by J×B, where J is the current vector resulting from the velocity of the charge carriers and B is the magnetic field vector. This Lorentz force is used to induce motion or to provide a bias force between the moving parts of the actuator.

Lithographic projection apparatuses can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus, each die is irradiated by progressively scanning the projection beam over the reticle pattern, and thus scanning a corresponding image onto the die; such an apparatus is referred to as a step-and-scan apparatus. Both of these types of apparatus require highly accurate relative positioning of the mask and substrate tables, which is generally accomplished with the aid of at least one Lorentz actuator. More information with regard to these devices can be gleaned from International Patent Application WO 97/33204.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine In currently available lithographic devices, the employed radiation is generally ultra-violet (UV) light, which can be derived from an excimer laser or mercury lamp, for example; many such devices use UV light having a wavelength of 365 nm or 248 nm. However, the rapidly developing electronics industry continually demands lithographic devices which can achieve ever-higher resolutions, and this is forcing the industry toward even shorter-wavelength radiation, particularly UV light with a wavelength of 193 nm or 157 nm. Beyond this point there are several possible scenarios, including the use of extreme UV light (EUV: wavelength~50 nm and less, e.g. 13.4 nm or 1 m), X-rays, ion beams or electron beams.

One problem with Lorentz actuators is that, when no current flows, there is no force between the moving parts. When a current is caused to flow to overcome this, it results in dissipation of heat in the device. This is particularly a problem in applications which require the actuator to deliver a bias force, e.g. to support the weight of a component under gravity. With this continuous need to compensate for weight, a base power dissipation is unavoidable, and can cause problems with heat sensitive apparatus, such as optical devices which require accurate alignment; on the other hand, it necessitates the provision of additional cooling power.

Another problem is that, when such actuators support a load in order to act as isolation bearings, the stiffness of the bearing should be low so as to avoid the transmission of vibrations. Conventionally, it has been difficult to provide such low-stiffness isolation bearings.

Velocity transducers can also operate on the Lorentz principle, by virtue of the fact that the motion of a component through a magnetic field induces a current flow or a resulting EMF which can be measured. In order to measure velocities down to very low frequencies, it is necessary to have a transducer with a very low frequency of resonance, which conventionally has been difficult to achieve. This is because of the problems in producing a transducer with a very low stiffness.

SUMMARY OF THE INVENTION

It is an object of the present invention to alleviate, at least partially, some of the above problems.

Accordingly, the present invention provides a device comprising:

a first member comprising at least one main magnet, and a second member comprising at least one current element for carrying an electric current, for electromagnetic interaction with said main magnet, characterized in that said second member further comprises an auxiliary magnetic member which interacts with the magnetic field of said main magnet to produce a bias force between said first and second members.

The invention also relates to a lithographic projection apparatus comprising a radiation system for supplying a projection beam of radiation; a mask table provided with a mask holder for holding a mask; a substrate table provided with a substrate holder for holding a substrate; a projection system for imaging an irradiated portion of the mask onto a target portion of the substrate; and further comprising a Lorentz actuator connected to at least one of the mask table and the substrate table.

The auxiliary magnetic member can be a permanent magnet. Alternatively, it can comprise a ferromagnetic material (e.g. a soft-iron member). In this latter case, as long as the stroke of movement of the current element/auxiliary magnetic member is relatively small (as will generally be the case in applications in short-stroke lithography actuators, for example)—such that the auxiliary magnetic member remains biased to one side of the centerline of the whole assembly—magnetic fluxes going through the ferromagnetic material of the auxiliary magnetic member will produce a bias force component in the desired direction; while less than that produced in the case of a permanent magnetic material, this force will be quite sufficient for particular applications.

The device according to the invention can be substantially planar or cylindrical, and the main magnet. can be magnetized perpendicular or parallel to the bias force.

Preferably, the device further comprises a third member, also comprising at least one further main magnet.

The current element may be a coil, and the auxiliary magnetic member is preferably located at a plane substantially centrally between two halves of the coil.

Advantageously, the effective stiffness of the device is 200 N/m or less in magnitude, and ideally close to zero.

The device can be used as an actuator and/or a velocity transducer.

The device can have two second members stiffly connected to each other and arranged such that opposite parasitic torques are generated in each second member, which thereby cancel out.

Advantageously, the actuator and/or transducer of the present invention can be used in a lithographic projection apparatus. A great advantage of the invention in such an application is that it provides a bias force capable of counteracting, for example, the weight of the table (chuck) in a wafer stage or reticle stage, and yet does so without the heat dissipation associated with current flow, thus helping to maintain a well-defined and constant local temperature. This is important, since the nanometer-accuracy commonly required of such apparatuses can only be satisfactorily achieved in a highly controlled environment, wherein unnecessary sources of heat and/or contamination (e.g. as a result of evaporation or outgassing) are highly undesirable. Such considerations are of particular importance in a vacuum environment, in which context it should be noted that lithographic apparatus for use with radiation types such as EUV, electron beams, ion beams, 157-nm UV, 126-nm UV, etc. will most probably comprise a vacuum along at least part of the radiation path within the apparatus.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC: Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

Embodiments of the present invention will now be described, by way of example only, with reference to the accompanying schematic drawings, whereby:

FIG. 1 illustrates a first embodiment of the invention in cross-section;

FIGS. 2(a) and 2(b) illustrate a second embodiment of the invention;

FIG. 3 illustrates a third embodiment of the invention;

FIGS. 4(a) and 4(b) give the dimensions of specific examples of the second and third embodiments of the invention;

FIGS. 5(a) to 5(g) illustrate further embodiments of the invention, which have configurations related to the second embodiment, together with graphs of calculated performance;

FIGS. 6(a) and 6(b) illustrate yet further embodiments of the invention, which have configurations of the same type as the third embodiment, together with graphs illustrating their calculated performance;

FIGS. 7–14 depict tabulated data as elucidated further hereafter;

In the Figures, corresponding parts are denoted using corresponding reference symbols.

DETAILED DESCRIPTION OF THE PREFERRED EMBODIMENTS

Embodiment 1

Figure 2A:
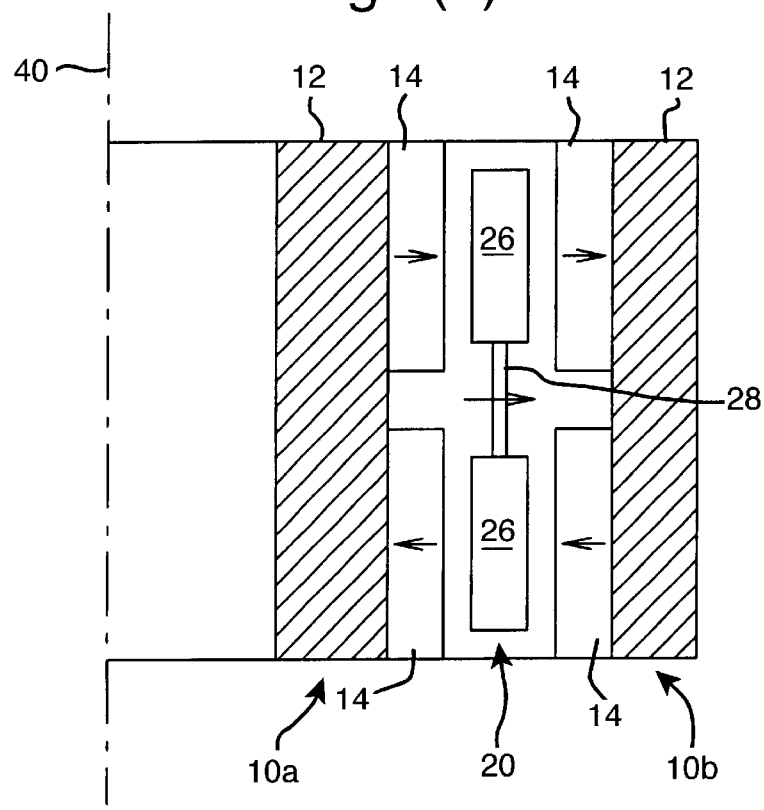

FIG. 1 shows the configuration of a linear Lorentz actuator according to a first embodiment of the present invention. It comprises a magnet yoke having upper and lower members 10a and 10b. Each member comprises a back-iron 12 which supports main magnets 14. Each main magnet is a permanent magnet which may include, for example, a ferromagnetic material. The direction of magnetization of each main magnet 14 is indicated by an arrow. Each member 10a, 10b comprises a pair of magnets 14, and there are four magnets in total in the magnet yoke.

Located between the upper and lower magnet yoke members 10a and 10b is a carrier member 20 which comprises cover plates 22, coil carrier 24 and two coil halves 26. The coil halves form a complete coil circuit, and are arranged to carry current perpendicular to the plane of the figure, one half carrying current in the opposite direction to the other half. In the middle of the carrier member 20 is an auxiliary magnetic member 28. In this particular case, this is also a permanent magnet, and can, for example, be made of the same material as the main magnets 14. The direction of magnetization of the auxiliary magnetic member 28 is indicated by its arrow.

The carrier member 20 is movable relative to the magnet yoke 10a, 10b. In the configuration shown in FIG. 1, the interaction between the main magnets 14 and the auxiliary magnetic member 28 produces a force that biases the carrier member 20 to the right relative to the magnet yoke. This bias force is present even when no current is flowing through the coil halves. When a current flows through the coil circuit in one sense, an additional force (Lorentz force) to the right is produced on the carrier member 20. When the current through the coil circuit flows in the opposite sense, a Lorentz force to the left is produced on the carrier member 20. The net force on the carrier member 20 depends on the bias force due to the presence of the auxiliary magnetic member and the Lorentz force caused by the coil current.

When the carrier member 20 is displaced within the yoke, forces in the vertical direction and also torques (principally about an axis perpendicular to the plane of FIG. 1) are produced. These are generally referred to as parasitic forces and torques, because they are not useful to the operation of the device and compensation must generally be made for them.

A Lorentz actuator or transducer also has an effective stiffness given by the change in force per unit displacement from a nominal operating position, typically the central position, for a given current level. This stiffness is also referred to as parasitic stiffness, since, for particular applications, an actuator should ideally apply a constant force with zero or minimal stiffness.

Finite element calculations have been performed to obtain data on the operational performance of an actuator of the type shown in FIG. 1. In the accompanying tables (FIGS. 7–14), the horizontal and vertical directions in the plane of FIG. 1 are referred to as the X and Y directions, respectively. The direction perpendicular to the plane of FIG. 1 is the Z direction. The device is taken to have the uniform cross-section as shown in FIG. 1, extending in the Z direction. After a non-linear calculation of the magnetic field distribution in the device, the forces and torque on the carrier 20 relative to the magnet yoke 10 are calculated by integration of the Maxwell stress along a contour containing the carrier 20. Calculated forces and torques are per unit length in the Z direction. A typical device as here considered has a length of 80 mm in the Z direction, and this number can be used to obtain values of the forces, torques and effective stiffness of a practical device.

Three different Examples of the device are discussed hereafter, the only differences between them being the dimensions of the auxiliary magnetic member 28, whereby L denotes length in the X direction, and H denotes height in the Y direction, both in mm. In Example 1, the dimensions of the auxiliary magnetic member 28 (L=10, H=8) are such that all the available space between the coil halves 26 (L=18, H=8) is filled, unlike the device illustrated in FIG. 1. In Example 2, the auxiliary magnetic member 28 (L=10, H=2) is relatively thin in the Y-direction, whereas in Example 3, the auxiliary magnetic member 28 (L=2, H=8) is relatively narrow in the X-direction. In all Examples, the main magnet 14 (L=24, H=8) was comprised of neodymium-iron-boron alloy RES275, and the back iron 12 (L=52, H=10) was comprised of standard ferromagnetic iron N041. Except where otherwise indicated, the auxiliary magnetic member 28 was also comprised of RES275. The current density in the coil half 26 was 10 A/mm$^2$.

Example 1

The table in FIG. 7 shows the results of calculations of the horizontal force (fx), vertical force (fy), and torque (tz) about an axis in the Z direction, exerted on the carrier member 20 for four different test conditions, but all with the dimensions of the device as specified above for Example 1 (L=10, H=8). For each of these four test runs, the carrier member 20 was kept in its nominal position, centrally located with respect to the magnet yoke. Values of fx and fy are in N and values of tz are in Nm, per mm in the Z-direction.

Runs 1 and 2 were with an RES275-grade magnet as the auxiliary magnetic member 28; run 1 was with no current flowing in the coil halves, and run 2 was with a current density of 10 A/mm$^2$. Run 3 was on the basis that the auxiliary magnetic member 28 was degraded to a ceramic-material-grade, and run 4 was a control with no auxiliary magnetic member.

The first, third and fourth runs reveal the force in the X direction produced by the auxiliary magnetic member 28 alone, the coil 26 alone, and the combination of auxiliary magnetic member 28 and coil 26. In this example, with all the available space between the coil halves filled with an RES275-grade magnet, the bias force is very large—about four times the force generated by the coil carrying 10 A/mm$^2$—and is actually larger than is often required. With a ceramic-material-grade auxiliary magnetic member, the bias force is reduced so as to be roughly equal to the force generated by the current, but the auxiliary magnetic member is locally irreversibly demagnetized by the main magnets over about 30% of its cross-sectional area.

Further runs were performed in which the position of the carrier member 20 was varied to determine stiffnesses due to magnetic coupling from the auxiliary magnetic member 28 to the main magnets 14. Coil current was kept at 0 A/mm$^2$ in order to isolate the permanent magnet effects. The table in FIG. 8 shows fx, fy and tz for various X displacements (Δx) and Y displacements (Δy) of the carrier member 20 (Δx and Δy in mm). From these results, it is possible to calculate the differential change in force (Δfx, Δfy) in the X and Y directions as a function of Δx and Δy, as shown in the table in FIG. 9 (Δfx, Δfy in N/m, per mm in the Z direction).

A typical actuator has a length of 80 mm in the Z direction, which gives the following equivalent stiffnesses for a practical device as: 5.9×10$^3$ N/m in the X direction and −1.2×10$^4$ N/m in the Y direction. The sign convention used when quoting these equivalent stiffnesses of an actuator differs from that used in the tables of FIGS. 7–14 for the following reasons. For a simple mechanical spring, a displacement in one direction produces a force in the opposite direction; however it is conventional to quote the stiffness of a spring as a positive value. Devices which exhibit the opposite behavior to a spring, such that a displacement in one direction produces an increased force in that direction, are conventionally quoted as having a negative stiffness (although in the tables these will appear as a positive value, because the displacement and force both change in the same direction).

Example 2

The tables of FIGS. 10 and 11 correspond to those of FIGS. 8 and 9, respectively, except in that they pertain to a device having the dimensions specified above for Example 2 (L=10, H=2). The magnitudes of the forces are obviously smaller, because the auxiliary magnetic member has a smaller volume. The equivalent stiffnesses for an 80 mm actuator are 2.4×10$^3$ N/m in the X direction and −2.0×10$^4$ N/m in the Y direction.

Example 3

The tables of FIGS. 12 and 13 correspond to those of FIGS. 8 and 9, respectively, except in that they pertain to a device having the dimensions specified above for Example 3 (L=2, H=8). For an 80 mm actuator, the equivalent stiffnesses are: $1.4 \times 10^4$ N/m in the X direction and $-2.9 \times 10^4$ N/m in the Y direction.

From all the above results, it is apparent that the bias forces produced by the auxiliary magnetic member in Examples 2 and 3 are roughly the same as the Lorentz forces produced by a current density of 10 A/mm$^2$; so depending on the direction of the current, the total force can be varied from approximately zero to roughly double the bias force for zero current by varying the current density between $-10$ A/mm$^2$ and $+10$ A/mm$^2$ (the sign giving the direction or "sense" of the current flow). In both Examples 2 and 3, the size of the auxiliary magnetic member is considerably less than the space available in the center of the coil.

The parasitic stiffness in these examples ranges from about $10^3$ N/m to $10^4$ N/m. The parasitic torque for an 80 mm device is about 0.6 Nm for a full size auxiliary magnetic member, as in Example 1, and about 0.12 Nm for Examples 2 and 3. The parasitic torque at maximum displacement in Y can be compensated for—e.g. by using two carrier members that are stiffly connected to each other and which, when displaced in an operational direction, generate opposite parasitic torques which cancel out.

Embodiment 2

Figure 2B:
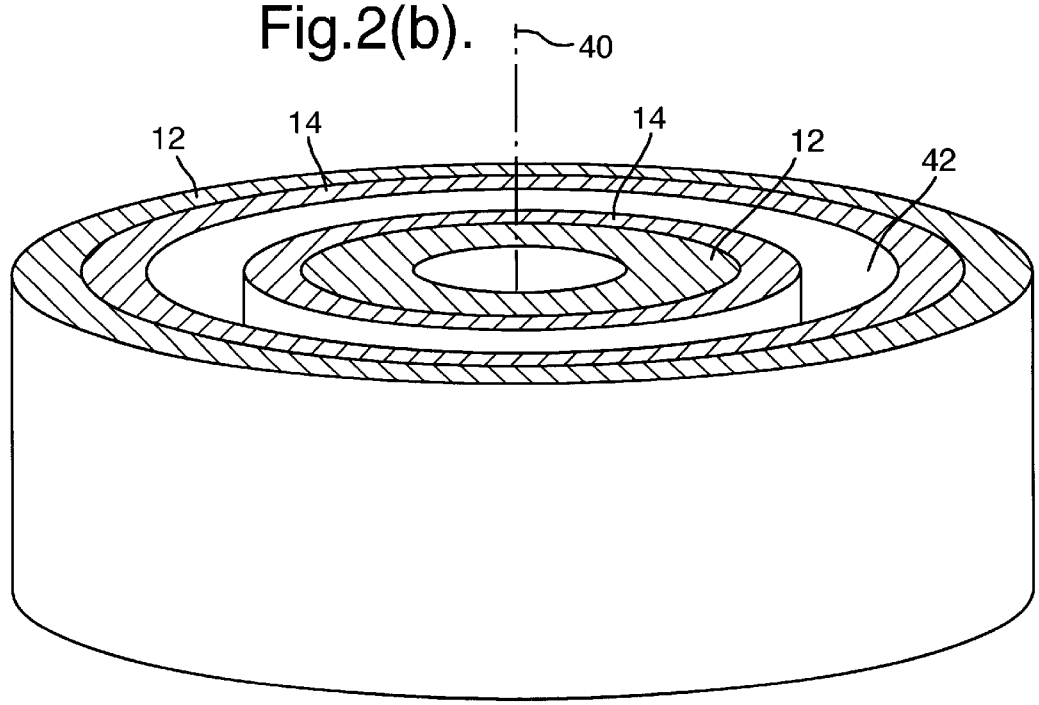

FIGS. 2(*a*) and (*b*) show a second embodiment of the invention. FIG. 2(*a*) shows a cross-section through half of the device, which looks essentially like the device of FIG. 1 turned on its end. The device of this embodiment has a cylindrical configuration, which is obtained by rotating FIG. 2(*a*) about axis 40 to produce the device shown in FIG. 2(*b*). In FIG. 2(*b*), the carrier member 20 has been omitted for clarity, but the tubular region in which it is located is indicated at 42.

As will be appreciated from FIG. 2, the main and auxiliary magnetic members are rings, magnetized in the radial direction. These magnets are routinely available, but are more difficult to make and magnetize than flat magnets, particularly when using anisotropic magnetic material.

Embodiment 3

Another cylindrical configuration is contemplated, according to a third embodiment of the invention shown in FIG. 3. As in FIG. 2(*a*), only half the device is shown in radial cross-section, and the complete device is a rotation of this figure about axis 40. In this embodiment, a single cylindrical main magnet 14 is provided, which is magnetized in the axial direction and is therefore somewhat simpler to manufacture than embodiment 2. The auxiliary magnetic member 28 is still ring-shaped, substantially the same as in the second embodiment. As shown in FIG. 3, the magnetic circuit is established using back-iron pieces 12 to form the magnet yoke. The coil halves 26 are positioned in the gaps in the magnetic circuit.

Embodiment 4

Devices such as that shown in FIG. 2, which have radially magnetized main magnets, are referred to as "type I", and devices such as that shown in FIG. 3, with an axially magnetized main magnet, will be referred to as "type II". From the magnetization directions of the main magnets 14 and auxiliary magnetic member 28 in both FIGS. 2 and 3, it will be apparent that the carrier member 20 will experience a bias force in the axial direction towards the top of each figure. Thus, these devices are useful (when oriented with the axis in the vertical direction) for supporting an axial load, such as bearing a load under gravity. In the type I device, the magnetization direction of the main magnets 14 is perpendicular to the bias force. In the type II device, the magnetization direction of the main magnets 14 is parallel to the bias force.

The planar, or linear, configuration of the device according to the first embodiment of the invention, shown in FIG. 1, has the advantage of manufacturing ease for the magnets, since they are rectangular-sided solids magnetized in a single direction. However, manufacture of the coil and guidance of the coil carrier member 20 can be relatively difficult. The cylindrical configurations of embodiments 2 and 3, shown in FIGS. 2 and 3, have simpler circular coils and provide better possibilities for coil guidance. The choice of planar or cylindrical configuration will depend upon the particular application and the trade-off between these considerations.

Figure 4A:
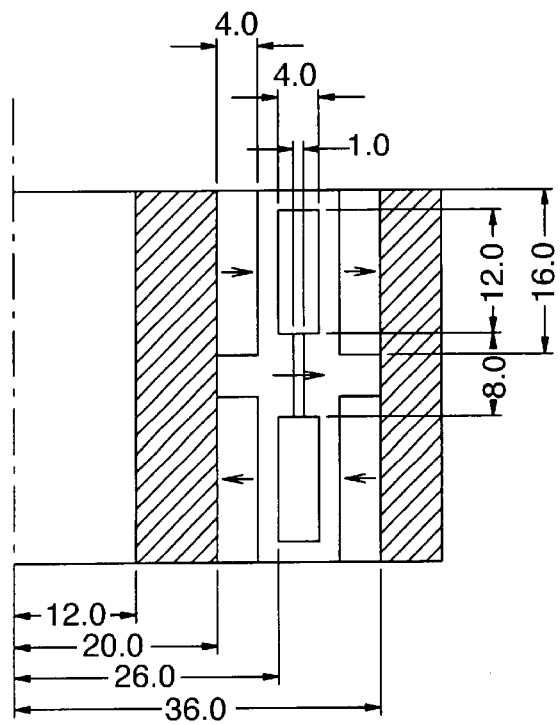
Figure 4B:
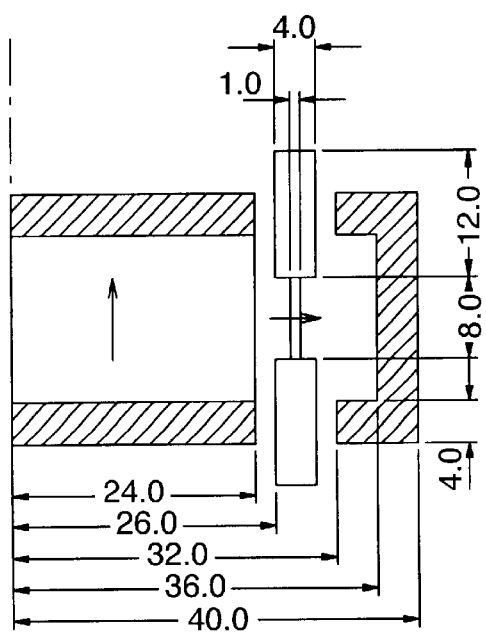
Figure 5A:
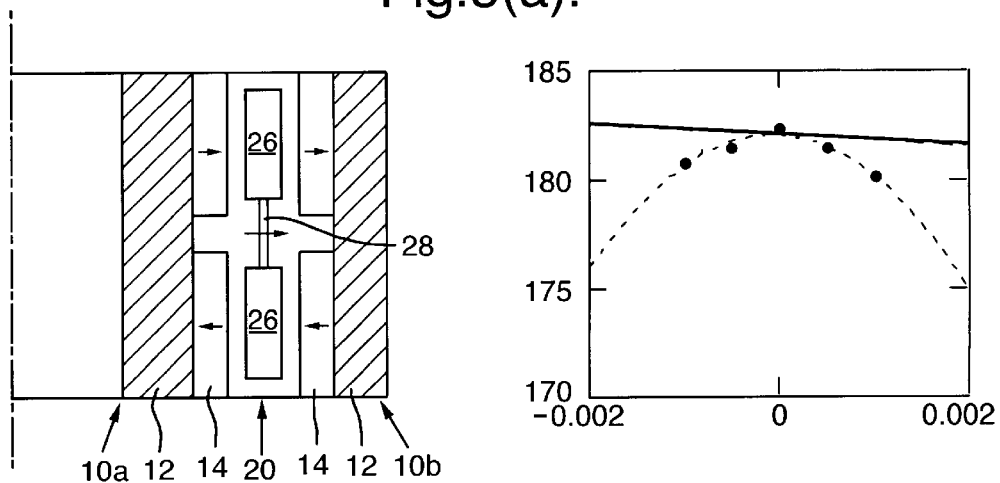
Figure 5B:
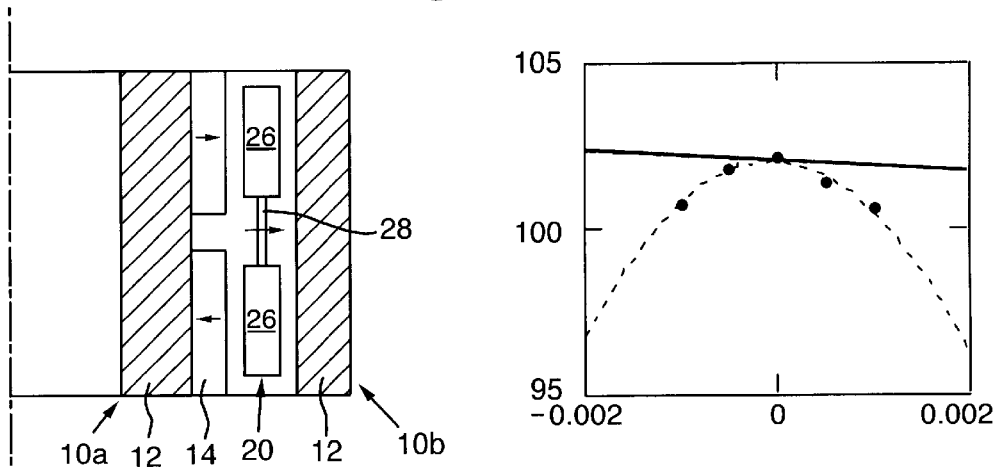
Figure 5C:
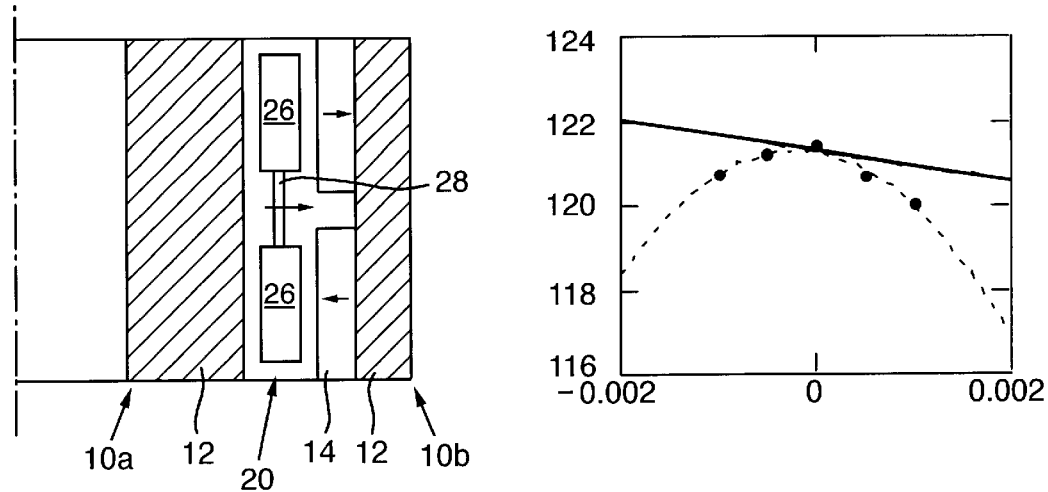
Figure 5D:
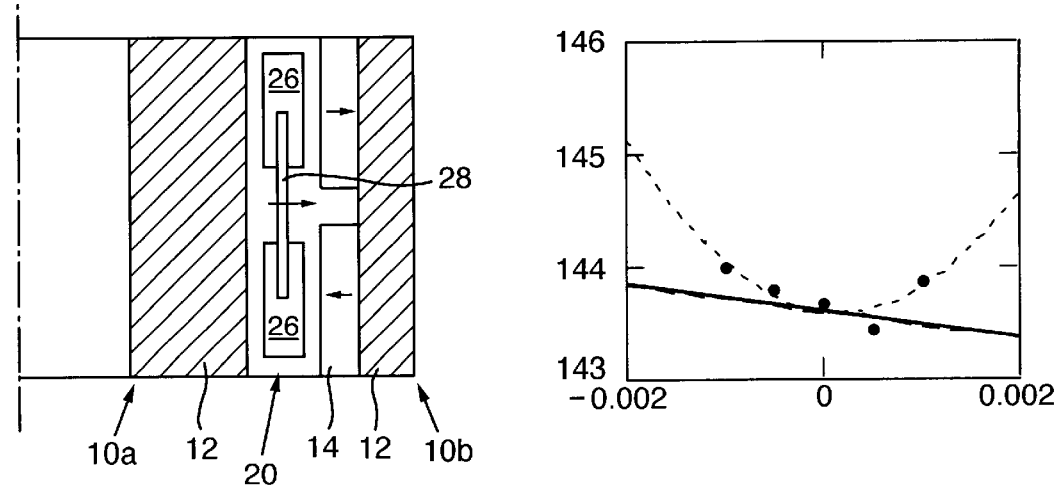
Figure 5G:
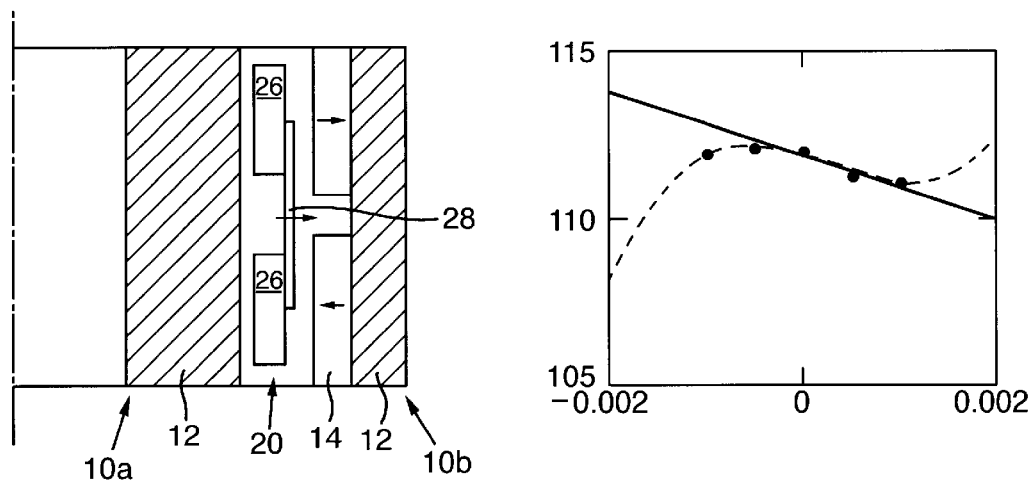

FIGS. 4(*a*) and 4(*b*) show exemplary dimensions (in mm) for devices of the second and third embodiment of this invention. Finite element analysis calculations have been performed to calculate the performance of devices with these dimensions. It is apparent that all the devices are axi-symmetric, which simplifies the calculations. A number of variations on the type I and type II configurations were considered. FIGS. 5(*a*) to 5(*g*) show type I devices and FIGS. 6(*a*) and 6(*b*) show type II devices. Each Figure shows on the left the configuration of the components of the device and on the right a plot of results which will be explained below. The device illustrated in FIG. 5(*a*) corresponds to the second embodiment of the invention as shown in FIGS. 2 and 4(*a*). The device in FIG. 6(*a*) corresponds to the third embodiment of the invention shown in FIGS. 3 and 4(*b*). The dimensions of the components in the further embodiments can be derived from the fact that FIGS. 5(*b*) to 5(*g*) are drawn to the same scale as FIG. 5(*a*), and FIG. 6(*b*) is to the same scale as FIG. 6(*a*).

For each embodiment, the force on the carrier member 20 (coils 26 plus auxiliary magnetic member 28) has been calculated using a Maxwell stress line integral. The coils are taken to have a current density of 10 A/mm$^2$, and the Lorentz force is calculated by integrating J×B over the volume of the coils. With the carrier member 20 in its central nominal position, the total force ($F_T$), Lorentz force ($F_L$) and auxiliary force ($F_A$, i.e. the bias force due to the auxiliary magnetic member 28) are given in the table in FIG. 14; all force values are in N. The column with parameter T indicates whether the tested device was type I or II.

Further calculations of the total axial force were performed for displacements of the carrier member 20 by 0.5 and 1.0 mm in both the up and down axial directions. A consistent convention was used, such that positive force and positive displacement are in the same direction. All forces and displacements are, of course, essentially relative forces and displacements between the carrier member 20 and the magnet yoke 10.

The graphs accompanying FIGS. 5 and 6 plot relative axial displacement in meters along the X axis and total axial force in N along the Y axis. The total axial force for displacements of $-1.0$, $-0.5$, 0, 0.5 and 1.0 mm are plotted as the five circles. The dotted line in each graph is a calculated fit to these points. Devices of type I have a force-versus-displacement curve of at least second order. Devices of type II have a first order (linear) force-versus-displacement function.

In each plot, the solid line shows the gradient of the force-versus-displacement plot at the zero displacement, nominal position. The gradient of this line gives the effective stiffness of the device, i.e. the differential change in force with displacement. As can be seen in FIGS. 5(a) to 5(g), the gradient for type I devices is negative; thus these have a mechanical spring-like stiffness, in that a displacement in one direction produces a change in force in the opposite direction. In contrast, type II actuators have a positive gradient, so do not behave like a mechanical spring, and have an equivalent stiffness which is negative.

The axial effective stiffness values S are given (in kN/m) in the final column in FIG. 14. The fact that type II devices have a negative stiffness means that, when the carrier member is displaced in the upward axial direction relative to the magnet yoke, the upward force on the carrier member 20 increases. This means that, when the bias force (auxiliary force) is compensating the weight of some apparatus, there is no stable equilibrium position. However, this is not a problem, because the coil currents can be controlled to counteract this negative stiffness as necessary.

As can be derived from the table in FIG. 14, stiffnesses of 1000 N/m or less can be achieved with these devices, and in some cases stiffnesses of less than 200 N/m are possible. The bias force and stiffness can both be tuned by choosing the axial dimension of the auxiliary magnetic member and its radial position.

Applications of these devices include use as short stroke drives for reticle and wafer stages in lithographic projection apparatus, and also as active bearing systems. The devices according to this invention have the significant advantage that they can support the weight of a load as an isolation bearing, without heat dissipation due to a base current. Current can, however, still be applied for control and adjustment, or to support further loads. The results in FIG. 14 show that examples of these devices can provide a bias force at least in the range of 40 to 100 N. In a typical lithographic projection apparatus, the moving mass of the wafer stage may be of the order of about 15 kg; in such a case, three actuators can (for example) be used, each compensating about 50 N of weight (i.e. 5 kg).

Another remarkable property of these devices is that, even when providing a compensating bias force of, for example, 40 to 100 N, they have effective stiffnesses of 1000 N/m or less, and even in some cases stiffnesses below 200 N/m. This would be very difficult to achieve with equivalent mechanical actuators or transducers. These devices essentially constitute a magnetic bearing with a very large compliance (small stiffness).

Further application of these devices, apart from as Lorentz actuators, is as a velocity transducer. Velocity differences between the coil carrier member 20 and the magnet yoke 10a, 10b cause generation of a proportional EMF in the coil. The bias force due to the auxiliary magnetic member is used to compensate the weight of the coil carrier member 20 with a very small equivalent stiffness. This gives the transducer a very low frequency of resonance, and enables it to be used to measure velocities down to very low frequencies.

Embodiment 5

Figure 15:
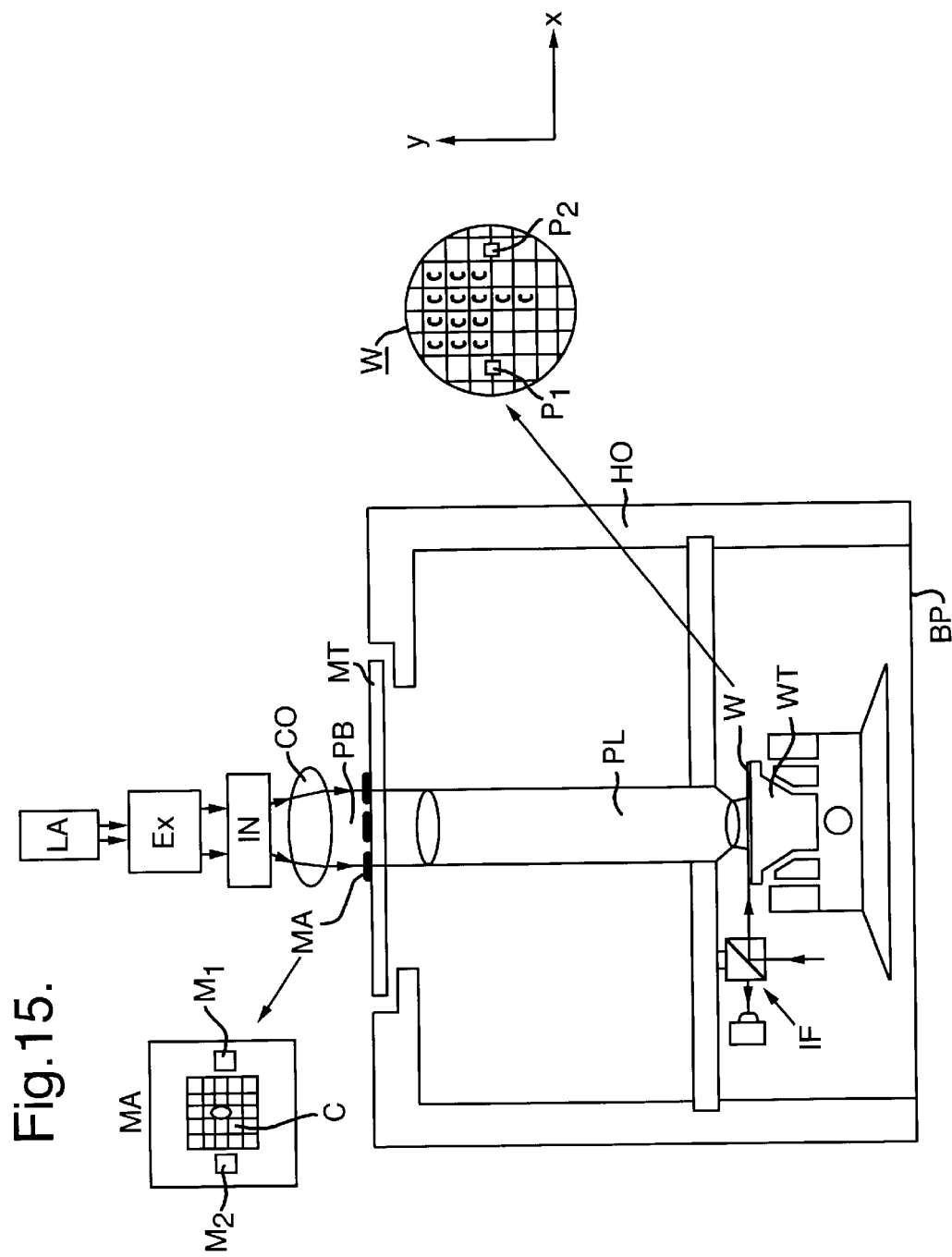
FIG. 15 shows an elevation of a lithographic projection apparatus employing an actuator in accordance with the invention.

FIG. 15 schematically depicts a lithographic projection apparatus according to the invention. The apparatus comprises:
- a radiation system LA, Ex, IN, CO for supplying a projection beam PB of radiation;
- a mask table MT provided with a mask holder for holding a mask MA (e.g. a reticle);
- a substrate table WT provided with a substrate holder for holding a substrate W (e.g. a resist-coated silicon wafer);
- a projection system PL (e.g. a lens or catadioptric system, a mirror group or a set of electromagnetic deflectors) for imaging an irradiated portion of the mask MA onto a target portion C (die) of the substrate W.

As here depicted, the apparatus is transmissive; however, an apparatus employing reflective components can also be envisioned (e.g. as in the case of an EUV apparatus).

The radiation system comprises a source LA (e.g. a Hg lamp or excimer laser, an electron or ion source, or a beam wiggler located around the path of a particle beam produced by an accelerator) which produces a beam of radiation. This beam is passed along various optical components,—e.g. beam shaping optics Ex, an integrator IN and a condensor CO—so that the resultant beam PB is substantially collimated and uniformly intense throughout its cross-section.

The beam PB subsequently intercepts the mask MA which is held in a mask holder on a mask table MT. Having passed through (or been reflected from) the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB.

The depicted apparatus can be used in two different modes:
- In step mode, the mask table MT is fixed, and an entire mask image is projected in one go (i.e. a single "flash") onto a target area C. The substrate table WT is then shifted in the x and/or y directions so that a different target area C can be irradiated by the (stationary) beam PB;
- In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

To achieve the required accuracy, and to avoid excessive wear, the mask table MT and substrate table WT are generally positioned in at least one degree of freedom (and generally as many as six degrees of freedom) with the aid of Lorentz actuators. In the Z-direction (i.e. perpendicular to the surface of the substrate table WT), not only will such a Lorentz actuator be necessary to produce Z-actuations, but some means must also be contrived to support the weight of the table being actuated. The actuator according to the current invention allows such support to be achieved without having to incur significant heat dissipation, and is thus highly advantageous in this application.

Whilst specific embodiments of the invention have been described above, it will be appreciated that the invention may be practised otherwise than as described.

The Claims accompanying this application have been provided with reference numerals between parentheses. These reference numerals are provided solely for the purpose of aiding the reader, so as to increase intelligibility; they should not be construed as limiting the scope of the Claims in any way to the particular examples depicted in the Figures.

I claim:

1. A device comprising:

a first member comprising at least one main magnet; and a second member comprising at least one current element constructed and arranged to carry an electric current, to electromagnetically interact with said main magnet, wherein said second member further comprises an auxiliary magnetic member which interacts with a magnetic field of said main magnet to produce a bias force between said first and second members, and wherein said magnet is magnetized in a direction substantially parallel to said bias force.

2. A device according to claim 1, wherein said first and second members are substantially planar.

3. A device according to claim 1, wherein said first and second members are substantially cylindrical or tubular.

4. A device according to claim 1, further comprising a third member comprising at least one further magnet.

5. A device according to claim 1, wherein said current element is a coil.

6. A device according to claim 5, wherein said auxiliary member is located at a plane which lies substantially centrally between two halves of said coil.

7. A device according to claim 1, wherein the effective stiffness of the device is a maximum of 200 N/m in magnitude.

8. A device according to claim 1, wherein said device is an actuator in which passage of current through said current element induces a controllable relative force between said first and second members.

9. A device according to claim 1, wherein said device is a transducer in which a velocity difference between said first and second members can be sensed by way of an EMF induced in said current element.

10. A device according to claim 1, comprising two second members stiffly connected to each other and arranged such that, in use, opposite parasitic torques are generated in each second member, which thereby cancel out.

11. A lithographic projection apparatus comprising:

a mask table provided with a mask holder constructed and arranged to hold a mask;

a substrate table provided with a substrate holder constructed and arranged to hold a substrate;

a projection system constructed and arranged to image an irradiated portion of the mask onto a target portions of the substrate, wherein the apparatus further comprises a device comprising:

a first member comprising at least one main magnet; and a second member comprising at least one current element constructed and arranged to carry an electric current, to electromagnetically interact with said main magnet, wherein said second member further comprises an auxiliary magnetic member which interacts with a magnetic field of said main magnet to produce a bias force between said first and second members, and wherein said main magnet is magnetized in a direction substantially parallel to said bias force.

12. An apparatus according to claim 11, wherein said first and second members are substantially planar.

13. An apparatus according to claim 11, wherein said first and second members are substantially cylindrical or tubular.

14. An apparatus according to claim 11, further comprising a third member comprising at least one further main magnet.

15. An apparatus according to claim 11, wherein said current element is a coil.

16. An apparatus according to claim 15, wherein said auxiliary magnetic member is located at a plane which lies substantially centrally between two halves of said coil.

17. An apparatus according to claim 11, wherein the effective stiffness of the device is 200 N/m or less in magnitude.

18. An apparatus according to claim 11, wherein said device is an actuator in which passage of current through said current element induces a controllable relative force between said first and second members.

19. An apparatus according to claim 11, wherein said device is a transducer in which a velocity difference between said first and second members can be sensed by way of an EMF induced in said current element.

20. An apparatus according to claim 11, comprising two second members stiffly connected to each other and arranged such that, in use, opposite parasitic torques are generated in each second member which thereby cancel out.

* * * * *